(12) United States Patent
Bessegato et al.

(10) Patent No.: US 9,853,749 B2
(45) Date of Patent: Dec. 26, 2017

(54) DATA INTEGRITY VIA GALVANICALLY ISOLATED ANALOG-TO-DIGITAL CONVERTER FOR INDUSTRIAL SYSTEMS

(71) Applicant: Infineon Technologies Austria AG, Villach (AT)

(72) Inventors: Renato Bessegato, Oberhaching (DE); Mohit Berry, Munich (DE)

(73) Assignee: Infineon Technologies Austria AG, Villach (AT)

( * ) Notice: Subject to any disclaimer, the term of this patent is extended or adjusted under 35 U.S.C. 154(b) by 136 days.

(21) Appl. No.: 14/596,863

(22) Filed: Jan. 14, 2015

(65) Prior Publication Data
US 2016/0204884 A1    Jul. 14, 2016

(51) Int. Cl.
*H04B 17/00* (2015.01)
*H03M 7/30* (2006.01)
*G01R 15/14* (2006.01)
*H03K 19/0175* (2006.01)
*H03M 1/06* (2006.01)

(52) U.S. Cl.
CPC ....... *H04B 17/0085* (2013.01); *G01R 15/144* (2013.01); *H03M 7/3006* (2013.01); *H03K 19/0175* (2013.01); *H03M 1/0617* (2013.01)

(58) Field of Classification Search
None
See application file for complete search history.

(56) References Cited

U.S. PATENT DOCUMENTS

| | | | | |
|---|---|---|---|---|
| 4,081,832 A * | 3/1978 | Sherman | ................. | H04N 7/163 348/E7.061 |
| 4,937,568 A * | 6/1990 | Nakanishi | ............... | H03M 9/00 326/93 |
| 5,870,046 A * | 2/1999 | Scott | ................... | H04B 14/062 341/143 |
| 8,873,644 B1 * | 10/2014 | Todsen | ................. | H03M 3/368 341/126 |
| 2009/0212759 A1 * | 8/2009 | Melanson | ............ | H03K 17/691 324/76.11 |
| 2013/0151184 A1 | 6/2013 | Rossi et al. | | |

* cited by examiner

*Primary Examiner* — Leon-Viet Nguyen
(74) *Attorney, Agent, or Firm* — Shumaker & Sieffert, P.A.

(57) ABSTRACT

Devices, systems, and methods for verifying integrity of a signal path across an isolation barrier are discloses. The devices, systems, and methods insert a marker signal into the signal path across the isolation barrier. The marker includes an analog signal. The devices, systems, and methods transmit a version of the marker signal across the isolation barrier and receiving a signal comprising the transmitted version of the marker signal. The devices, systems, and methods verify the integrity of the signal path based on the received signal.

13 Claims, 4 Drawing Sheets

DATA INTEGRITY VIA GALVANICALLY ISOLATED ANALOG-TO-DIGITAL CONVERTER FOR INDUSTRIAL SYSTEMS

TECHNICAL FIELD

This disclosure relates to data integrity and more particularly, to techniques and circuits associated with checking data integrity of a signal path.

BACKGROUND

The term data integrity refers to maintaining and assuring the accuracy of data. The opposite of data integrity is data corruption. Data corruption generally leads to data losses. Data integrity may be an important aspect to the design, implementation and usage of any system which stores, processes, or retrieves data. Accordingly, it can be important to implement data integrity techniques to ensure data is correctly processed, stored, and retrieved, such that upon later retrieval, the data is correct. Data integrity aims to prevent unintentional changes to information. Any unintended changes to data is failure of data integrity. Changes may occur as the result of a storage operation, retrieval operation or processing operation. These may be cause by malicious intent, unexpected hardware failure, human error, or other causes.

In typical industrial measurement applications, such as energy meters, servers and measurement equipment, data integrity may be an important aspect to the design. Data integrity may be particularly important for systems that relate to isolated power domains. One example of industrial measurement applications where data integrity may be an important aspect to the design is energy meters. The energy meter may measure energy usage information. Energy usage information may be directly related to revenues for the sale or purchase of the energy used. Accordingly, energy measured by the energy meter may be critical information, as it may directly relate to monetary values, which may generally be important aspects of various businesses transactions.

SUMMARY

In general, techniques and circuits are described that may be used for verifying integrity of a signal path across an isolation barrier. These techniques and circuits may insert a marker signal into the signal path across the isolation barrier. The marker includes an analog signal. The techniques and circuits may transmit a version of the marker signal across the isolation barrier and receive a signal comprising the transmitted version of the marker signal. These techniques and circuits may verify the integrity of the signal path based on the received signal.

In some examples, the disclosure is directed to a method of verifying integrity of a signal path across an isolation barrier, the method including inserting a marker signal into the signal path across the isolation barrier, the marker comprising an analog signal, transmitting a version of the marker signal across the isolation barrier, receiving a signal comprising the transmitted version of the marker signal, and verifying the integrity of the signal path based on the received signal.

In an example, the disclosure is directed to an electronic device for verifying integrity of a signal path across an isolation barrier, the electronic device including circuitry for inserting a marker signal into the signal path across the isolation barrier, the marker comprising an analog signal, circuitry for transmitting a version of the marker signal across the isolation barrier, circuitry for receiving a signal comprising the transmitted version of the marker signal, and circuitry for verifying the integrity of the signal path based on the received signal.

In another example, the disclosure is directed to an electronic device for verifying integrity of a signal path across an isolation barrier, the electronic device including means for inserting a marker signal into the signal path across the isolation barrier, the marker comprising an analog signal, means for transmitting a version of the marker signal across the isolation barrier, means for receiving a signal comprising the transmitted version of the marker signal, and means for verifying the integrity of the signal path based on the received signal.

The details of one or more examples are set forth in the accompanying drawings and the description below. Other features, objects, and advantages of the disclosure will be apparent from the description and drawings, and from the claims.

DETAILED DESCRIPTION

Figure 1:
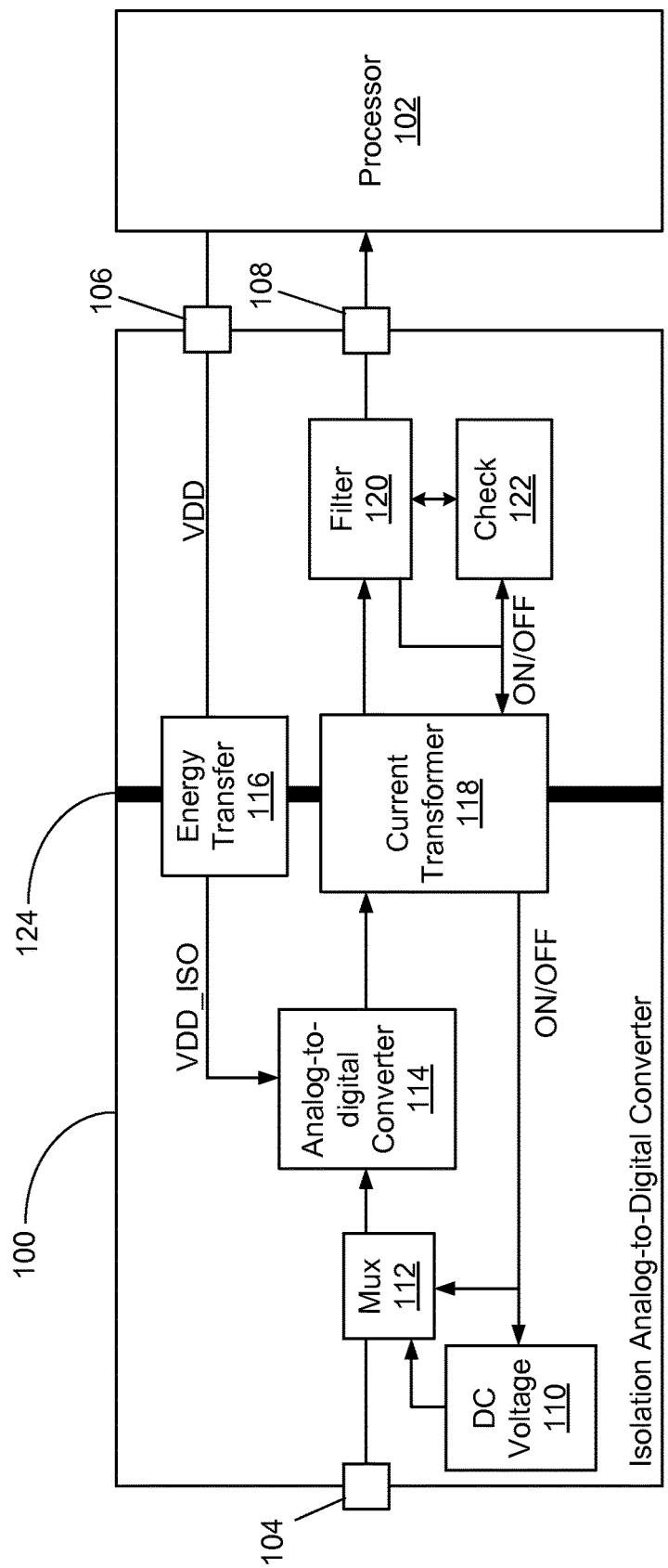
FIG. 1 is a block diagram illustrating one example system for verifying integrity of a signal path across an isolation barrier in accordance with one or more aspects of the present disclosure.

In general, techniques and circuits are described that may be used for verifying integrity of a signal path across an isolation barrier. Generally, the isolation barrier may include a galvanic isolation barrier. Galvanic isolation is a principle of isolating functional sections of electrical systems to prevent current flow. With galvanic isolation there is no direct conduction path permitted. Even though there is no current flow when galvanic isolation is used, energy or information can still be exchanged between the sections by other means, such as capacitance, induction or electromagnetic waves, or optically, acoustically or mechanically.

In some examples, techniques and circuits may be configured to insert a marker signal into the signal path across the isolation barrier. Inserting the marker signal into the signal path may include multiplexing the marker signal and at least one other input signal into the signal path. The multiplexed marker signal may include an analog signal, such as a known direct current (DC) voltage, a sine wave, or other wave form. In some examples, inserting the marker signal into the signal path may include superimposing the marker signal and at least one other input signal into the signal path. In such an example, the marker that is superimposed may include an analog signal, such as a known direct current (DC) voltage, a sine wave, or other wave form.

The techniques and circuits of this disclosure may transmit a version of the marker signal across the isolation barrier and receiving a signal comprising the transmitted version of the marker signal. For example, some techniques and circuits of this disclosure may be configured to convert the marker signal to a digital signal in the signal path. Accordingly, in this case, the digital signal may be the version of the marker transmitted across the isolation barrier. Because of the isolation barrier, one part of the circuitry does not have complete information on another part of the circuitry. Some examples described herein may be used to help verify that the data is correct and not corrupted (e.g., from tampering, noise, modified environmental condition, or other sources of data corruption).

The techniques and circuits described herein may verify the integrity of the signal path based on the received signal. For example, a received signal may be compared to a marker signal inserted into the signal path. The marker signal inserted into the signal path may be, for example, a predetermined signal such as a predetermined DC voltage or a predetermined sine wave, e.g., a sine wave with a predetermined frequency and a predetermined amplitude. Because the marker signal inserted into the signal path may be a predetermined signal, a representation of the predetermined signal may be stored for use by a processor or other check circuitry. For example, the representation of the predetermined signal may be stored in a memory or other data storage device accessible by the processor or other check circuity. Additionally, because a representation of the predetermined signal may be stored for use by a processor or other check circuitry, the representation of the predetermined signal may be compared to a received representation of the marker signal transmitted over the signal path that is being checked using the systems and methods described herein.

Differences between the received signal and the marker signal that was inserted into the signal path may be due to problems in the signal path, such as, tampering with the signal path or other data integrity problems, whether caused by malicious intent, unexpected hardware failure, human error, or other causes. Accordingly, comparing a received signal to the marker signal can be used to identify problems with the signal path.

Generally, in some industrial measurement applications, including, for example, meters (e.g., energy meters), servers, and/or measurement equipment, sensing may be performed by a combination of current transformers and discrete analog-to-digital converters. Such systems may have various disadvantages, for example higher cost, instability in temperature, sensitivity to magnetic attack, larger size, requirements for manual assembly, and so on. Accordingly, cost effective, reliable and accurate performance of shunt based measurements with galvanic insulation on the digital domain may be advantageous. One example which describes the feature and benefits of self-powered galvanic insulated ADC devices (e.g., isolation ADC or ISOADC) is disclosed in U.S. patent application Ser. No. 13/313,460, filed Dec. 7, 2011, which is incorporated herein by reference in its entirety. In electronics, a shunt is a device which allows electric current to pass around another point in the circuit by creating a low resistance path.

Data integrity may be an important aspect for the design of many different data signaling techniques, devices, and systems. This may be particularly true for "revenue based measurement" data integrity. "Revenue based measurement" may include any setting where the data is connected to some source of revenue such that an error in the data may impact the revenue. For example, a meter of some kind may be used to measure electricity usage, natural gas usage, energy content of natural gas, flow of gasoline, e.g., from a storage tank to a tank in a vehicle, or many other measurements for which meters are used. Errors in such measurements may impact revenue.

An error in an electric meter can result in an electricity utility customer being charged too much for the actual electrical energy or being charged too little for actual electrical energy use. For example, if an electricity utility customer uses 1000 kilowatt hours, but data received over a data path from an electrical meter indicates 999 kilowatt hours, the errors in the data path may have caused a discrepancy between energy use and energy billings to the customer. Conversely, if an electricity utility customer uses 1000 kilowatt hours, but data received over a data path from an electrical meter indicates 1001 kilowatt hours, the errors in the data path may have caused a discrepancy between energy use and energy billings to the customer. These errors between the electricity used and the received measurement data may be caused by malicious intent, unexpected hardware failure, and human error, or other causes.

A kilowatt-hour is a unit of measure that may be commonly used as a billing unit for energy delivered to consumers by electric utilities. One kilowatt hour (kWh) is equal to 1,000 watt-hours, or 3.6 megajoules.

In some examples, it may be important that a sample measured at an input is reliably transferred over an isolation to a control side wherein various computations may be performed by a processor, such as a microprocessor, microcontroller, or digital signal processor (DSP).

Data integrity and reliability is an increasingly important topic. Accordingly, some examples described herein relate to techniques and circuits associated with checking data integrity of a signal path over a galvanic isolation barrier. In some examples, anti-tampering protection and data integrity may be implemented in the software domain or digital environment. There has not been a proposal to resolve this issue on raw data samples. The systems and methods described herein generally address data integrity issues starting at or near the raw data samples by incorporating "a marking" facility on an isolation analog-to-digital converter. The "marking" techniques described herein may avoids problems with respect to data integrity. As described herein, a "marked" raw data sample at an input, after transmission through an isolation barrier, should be similar to retrieved data at the low side. Accordingly, in some examples, the received data and the input data may be compared to determine data path integrity.

Some examples described herein may insertion a "marker" on a raw analog sample captured by a linear current sensor such as a shunt resistor. Generally, a shunt resistor is a resistor used to measure electric current by measuring a voltage drop across the shunt resistor. The current flow may be calculated using Ohm's law, e.g., voltage (V) equals current (I) times resistance (R), V=IR.

Some examples may help to improve or guarantee data integrity and avoid corruption of the raw data that may be transmitted across an integrated isolation path, e.g., with galvanic isolation using a "marked sample." The marked sample, when transmitted through an isolation barrier and meaningfully retrieved on the low side may mitigate data spoofing. Data spoofing may generally refer to any attempt to distort a signal in, for example, price sensitive markets like the Asian Pacific Market. Some examples may facilitate data integrity in an open loop topology without the intervention of an external processor, such as a microprocessor, a field programmable gate array (FPGA), a digital signal processor (DSP), or any other processing circuitry that might receive data from an isolation analog-to-digital converter. Such an example might use other circuitry, such as a check block, that may be internal to isolation the analog-to-digital converter to verify that a received signal is correctly being received through the galvanic isolation layer, while the processor may be external to the isolation analog-to-digital converter.

Some examples may make use of a fully integrated galvanic insulation solution, packaging one or more "marking" blocks, one or more analog-to-digital converters, one or more coreless transformers, insulation engines, bias circuitry, a clock recovery unit and a power generation unit. Also, in some examples, power transfer implemented through a coreless transformer with galvanically insulated section(s), (i.e. the analogue front end, analog-to-digital converters, bias circuitry, clock recovery unit and the coreless engine handler) may be self-powered and avoid usage of dedicated power supply. In other words, multiple isolated power domains and power domains that are not isolated may be powered from a single power supply that may be located with a master controller, rather than using multiple power supplies, e.g., one for each isolated power domain and at least one power supply for any power domain that is not isolated. This may reduce cost in terms of parts count and printed circuit board size. Generally, the systems and methods may be used to verify that a received signal is correctly being sensed and received by a processor through the galvanic isolation layer. Other solutions may merely check the integrity of the signal that passes through the galvanic isolation layer, but do not check whether the "sensor block" is actually sensing correctly. Various systems and methods described herein may check the integrity of a signal that passes through the galvanic isolation layer all the way from the "sensor block" to through the galvanic isolation layer, checking if a signal is actually sensing correctly.

Various examples may use, circuitry such as multiplexers, signal addition/subtraction circuitry, signal addition circuitry, or other circuitry designed to multiplex, add, subtract, superimpose, or otherwise select or combined signals to insert a marker signal into a signal path across an isolation barrier. A current transformer may transmit a version of the marker signal across the isolation barrier. For example, the current transformer may transmit a digital version of the marker signal across the isolation barrier. The digital version of the marker signal may be generated using an analog-to-digital converter. The received signal may be filtered using a filter, such as a band pass filter, a low pass filter, high pass filter, or some combination of filters. In some examples, the filter may process the received signal to separate the known reference signal and the signal input on input pin. A check block and/or processor may then receive the filtered signal comprising the transmitted version of the marker signal. The check block and/or processor or other processing circuitry may verify the integrity of the signal path based on the received signal.

FIG. 1 is a block diagram illustrating one example system for verifying integrity of a signal path across an isolation barrier in accordance with one or more aspects of the present disclosure. In some examples, an aspect of the present disclosure is to check the integrity of a data path through an isolation analog-to-digital converter 100. Checking of data integrity may be done by sending a known signal through isolation analog-to-digital converter 100 and checking the received signal output by isolation analog-to-digital converter 100, e.g., at check block 122 or processor 102. In some examples, isolation analog-to-digital converter 100 may be separate circuitry, an integrated circuit (IC), a system on a chip, or other configuration circuitry.

In the example of FIG. 1, isolation analog-to-digital converter 100 is coupled to processor 102. Processor 102 may be a microprocessor, a microcontroller, a digital signal processor (DSP), a field programmable gate array (FPGA), or any other processing circuitry that might receive data from isolation analog-to-digital converter 100. Isolation analog-to-digital converter 100 may output data to Processor 102 using output pin 108. Processor 102 may provide a voltage source, VDD to voltage input pin 106 of isolation analog-to-digital converter 100.

The illustrated isolation analog-to-digital converter 100 of FIG. 1 also includes an input pin 104 that may be an analog input pin, i.e., a pin configured to receive an analog input. Using input pin 104, a signal, such as an analog signal, may be input to isolation analog-to-digital converter 100, processed by circuitry within isolation analog-to-digital converter 100 and output at output pin 108. The signal output at output pin 108 may not be in the same form as the signal input at input pin 104. For example, an analog signal may be input at input pin 104 and a digital signal may be output at output pin 108. Thus, output pin 108 may be a series of digital output pins, rather than a single output pin, in some examples. Generally, however, the signal output at output pin 108 may include similar information to the signal input at input pin 104, at least when a signal input on input pin 104 is being processed by isolation analog-to-digital converter 100, i.e., when input pin 104 is connected to analog-to-digital converter 114 through multiplexer 112 rather than DC voltage 110. For example, the series of digital outputs may output a digital value that is representative of a signal input on input pin 104 or DC voltage 110 depending on the value the multiplexer is allowing to pass to analog-to-digital converter 114.

The block diagram of FIG. 1 illustrates an example system for verifying integrity of a signal path across an isolation barrier using what may be a non-continuous approach. In other words, a test signal, e.g., DC voltage 110 and an input signal at input pin 104 may be alternatively selected as an input to analog-to-digital converter 114 using a multiplexer (Mux) 112. Multiplexer 112 may be referred to as an "ON/OFF" mux and may be used to select a known input signal, e.g., DC voltage 110, as an input to analog-to-digital converter 114.

One side of isolation analog-to-digital converter 100 is isolated from the other side of isolation analog-to-digital converter 100. For example, input pin 104, DC voltage 110, multiplexer 112, and analog-to-digital converter 114 are on the left side (as drawn in the diagram). This may be referred to as the "input side." Voltage input pin 106, output pin 108, filter 120, and check block 122 are on the right side (as drawn in the diagram). This may be referred to as the "low side." The low side is isolated from the input side through energy transfer 116 and coreless transformer 118. Generally the right side of the diagram may be thought of as driving the left side of the diagram in the sense that check block 122 may control the ON/Off signal that selects if verification is performed.

To further illustrate the isolated in FIG. 1, the input side (left side) and the low side (right side) are generally separated in the block diagram of FIG. 1 along isolation barrier 124. Isolation barrier 124 generally indicates one example of groupings of components by one example of how such components might be grouped relative to the input side and the low side, e.g., input pin 104, DC voltage 110, multiplexer 112, and analog-to-digital converter 114 (left side); and voltage input pin 106, output pin 108, filter 120, and check block 122 (low side); with energy transfer 116 and coreless transformer 118 are components used to provide the barrier between the left and right side.

The isolation provided between the left side and the right side may generally be galvanic isolation. As described above, galvanic isolation is a principle of isolating functional sections of electrical systems to prevent current flow. With galvanic isolation no direct conduction path is permitted. Energy or information can still be exchanged between the sections by other means, such as capacitance, induction or electromagnetic waves, or optically, acoustically or mechanically. Some examples of galvanic isolation may use transformers, opto-isolators, capacitors, hall effect sensors, or magnetocouplers.

Input on input pin 104 and DC voltage 110 may be detected on the input side, depending on the selection at multiplexer 112. DC voltage 110 may provide a known voltage input to analog-to-digital converter 114 that may be used to check the integrity of the data path through isolation analog-to-digital converter 100. By sending the known DC voltage through isolation analog-to-digital converter 100 a check on the signal path may be performed by checking to see if the received signal output by isolation analog-to-digital converter 100, e.g., at processor 102 is an accurate representation of the known DC voltage. For example, a digital representation of DC voltage 110 may be output using output pin 108 and processed by processor 102 to potentially determine the integrity of the data path, e.g., by comparing the received signal to the known DC voltage 110. In other examples, check block 122 may verify that a received signal is correctly being sensed and received by a processor through the galvanic isolation layer. This may be accomplished by providing a representation of the known test signal from filter block 120 to check block 122. In examples where the known test signal is provided from filter block 120 to check block 122 the known test signal might be filtered out of the signal output at output 108 because processor 102 may not need the test signal because it is processed by check block 122.

It will be understood that many different representations of DC voltage 110, received at output pin 108 are possible, depending on the specific implementation. For example, output pin 108 may be used to output a digital representation or an analog representation, as discussed above. Furthermore, an analog representation of DC voltage 110 at output pin 108 may be a voltage at or near DC voltage 110 or the analog representation of DC voltage 110 at output pin 108 may be a voltage that is a function of DC voltage 110, e.g., 2×DC voltage 110, 0.5×DC voltage 110. Similarly, a digital representation of DC voltage 110 at output pin 108 may be a series of bits representing a voltage at or near DC voltage 110 or the digital representation of DC voltage 110 at output pin 108 may be a series of bits representing a voltage that is a function of DC voltage 110, e.g., bits indicating 2×DC voltage 110, 0.5×DC voltage.

As described above, the example circuitry of FIG. 1 may be used to check the integrity of a data path through isolation analog-to-digital converter 100 by sending known DC voltage 110 through isolation analog-to-digital converter 100 and checking the received signal output by isolation analog-to-digital converter 100, e.g., at check block 122 or at processor 102. In some examples, this may be performed periodically. In other examples, sending known DC voltage 110 through isolation analog-to-digital converter 100 and checking the received signal output by isolation analog-to-digital converter 100, e.g., check block 122 or at processor 102, may be performed during calibration of signal path.

Once the circuitry is checked and it is determined to be functioning correctly or functioning within an acceptable accuracy range a "meaningful analog sample," e.g., a data signal at input pin 104, may be captured from a shunt sensor, such as a shunt resistor, to be processed by the analog-to-digital converter 114, transmitted through coreless transformer (CT) 118 and then detected at low side of isolation analog-to-digital converter 100. Having the circuitry function correctly or within an acceptable accuracy range may vary from implementation to implementation. In some examples, it may be necessary for the data output at output pin 108 to correspond exactly to the data signal input at input pin 104. In other examples, it may be necessary for the data output at output pin 108 to correspond to the data signal input at input pin 104 within 0.01%, 0.1%, 1%, 10%, or some other percentage, as may be determined based on requirements for the particular system. This correspondence may be checked using the systems and methods described herein, wherein a known signal is sent along the same data path and what is received is compared to the known signal.

In some examples, when the data output at output pin 108 is a digital value, the output may have to be accurate to within a certain number of bits at the output. For example, within 1 bits, 2 bits, or some other number of bits. As an example, assume that analog-to-digital converter 114 converts an analog input, such as DC voltage 110 or the input on input pin 104, to a 16 bit value, and this value must be received within 1 bit. Further assume that multiplexer 112 selects DC voltage 110 and that DC voltage 110 is converted to a digital representation using analog-to-digital converter 114. Assume that this digital representation is made up of the following string of bits: 1000 0000 0000 0000. If 1 bit accuracy is needed, then the binary values 1000 0000 0000 0001, 1000 0000 0000 0000, and 0111 1111 1111 1111 would each be considered accurate enough, while other binary values, such as 1000 0000 0000 0010 and 0111 1111 1111 1110 would not be considered accurate enough.

Additionally, the tolerances described above may also be applied to a system where the output is some function of the input, e.g., 0.5×input, 2×input. Accordingly, the output might have to be within 0.01%, 0.1%, 1%, 10% of 2×input (e.g., in the example where the output a function of the input and is supposed to be 2×input).

As described herein, the example system of FIG. 1 for verifying integrity of a signal path across an isolation barrier in accordance with one or more aspects of the present disclosure may be used either for in non-continuous sensing applications, during system startup, or both. The system of FIG. 1 may be used where integrity of a data path through an isolation barrier is checked. The "ON/OFF" signal may be used to select between verifying using DC voltage 110 and processing a data signal input at input pin 104. The "ON/OFF" signal may pass through coreless transformer 118. In some examples, passing the ON/OFF signal through coreless transformer 118 may be achieved by modulating the clock. In such an example the ON/OFF signal may be modulated on to the clock signal. One example may use amplitude modulation. An example of amplitude modulation may provide ON information by increasing the amplitude of the clock pulses while for OFF the amplitude of the clock pulse may be restored to original value. Another example may use clock pulse modulation where a train of clock pulse encodes the operating clock and the ON/OFF signal information.

In one example, as illustrated in FIG. 1, circuitry such as multiplexer 112 or other circuitry designed to multiplex or otherwise select signals may be used to insert a marker signal into a signal path across an isolation barrier 124. Coreless transformer 118 may transmit a version of the marker signal across isolation barrier 124. For example, coreless transformer 118 may transmit a digital version of the marker signal across isolation barrier 124. The digital version of the marker signal may be generated using analog-to-digital converter 114. The received signal may be filtered at filter 120. Filter 120 may be a band pass filter, a low pass filter, high pass filter, or some combination of filters. In some examples, filter 120 may process the received signal to separate the known reference signal and the signal input on input pin 104. Check block 122 and/or processor 102 may then receive the filtered signal comprising the transmitted version of the marker signal. Check block 122 and/or processor 102 or other processing circuitry may verify the integrity of the signal path based on the received signal. In some examples, the techniques and circuits described herein may be configured such that these techniques and circuits do not need a calibration phase for cases when a marker is passed from the low side (right side as drawn in the circuit diagram). One example configuration when the techniques and circuits described herein do not need a calibration phase is when the power supply of the low side is provided by the input side (the left side as drawn in the diagram) when an example circuit is operating in a continuous mode.

Figure 2:
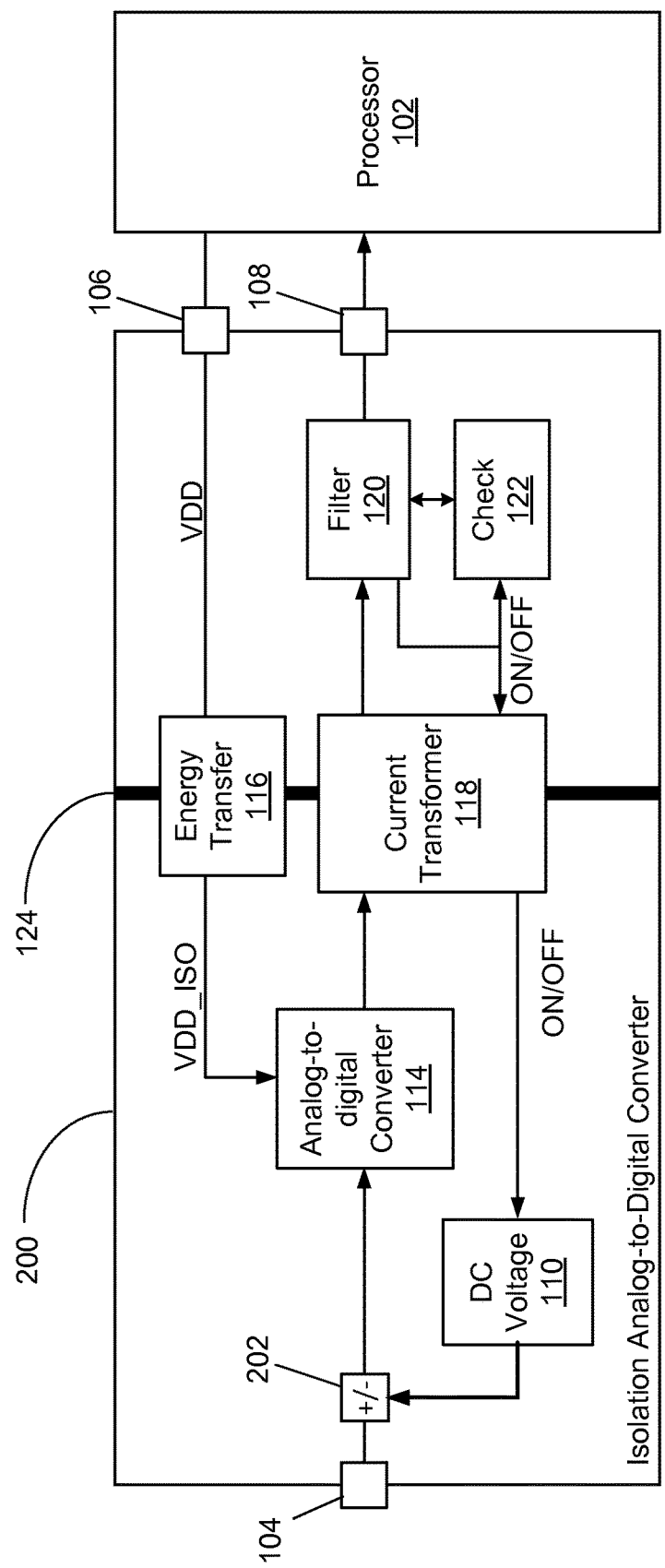
FIG. 2 is a block diagram illustrating another example system for verifying integrity of a signal path across an isolation barrier in accordance with one or more aspects of the present disclosure.

FIG. 2 is block diagram illustrating another example system for verifying integrity of a signal path across an isolation barrier in accordance with one or more aspects of the present disclosure. In some examples, an aspect of the present disclosure is to check the integrity of a data path through an isolation analog-to-digital converter 200. Checking the integrity of a data path through isolation analog-to-digital converter 200 may be done by adding a known signal to an input signal and inputting the combined signal to analog-to-digital converter 114 and checking the received signal output by isolation analog-to-digital converter 200 after processing through the circuitry of isolation analog-to-digital converter 200. The checking may be done, for example by check block 122 or processor 102. In some examples, isolation analog-to-digital converter 200 may be separate circuitry, an integrated circuit (IC), a system on a chip, or other circuitry configuration.

FIG. 2 is generally similar to FIG. 1 and includes an isolation analog-to-digital converter 200 that is coupled to processor 102. Isolation analog-to-digital converter 200 may output data to processor 102 from output pin 108. Processor 102 may again provide a voltage source, VDD to voltage input pin 106 of isolation analog-to-digital converter 200.

The illustrated isolation analog-to-digital converter 200 of FIG. 2 also includes input pin 104 that may be an analog input and an output at output pin 108. As described above, the signal output at output pin 108 may not be in the same form as the signal input at input pin 104. For example, an analog signal may be input at input pin 104 and a digital signal may be output at output pin 108.

The block diagram of FIG. 2 illustrates an example system for verifying integrity of a signal path across an isolation barrier using what may be a continuous approach. In other words, a test signal, e.g., DC voltage 110 and an input signal at input pin 104 may both be input into an input of analog-to-digital converter 114 at the same time. Accordingly, while multiplexer 112 is illustrated in FIG. 1, no multiplexer is needed or illustrated in FIG. 2. Rather, addition/subtraction circuitry 202 is used in FIG. 2.

The example of FIG. 2 may be described as a continuous approach because it is possible to transmit both the known DC voltage and the signal on input pin 104 at the same time and thus it is possible to continuously verify integrity of the signal path across the isolation barrier. While the example of FIG. 2 may be described as a continuous approach, this does not mean that the example of FIG. 2 must be used to continuously verify integrity of the signal path across the isolation barrier. Rather, the example of FIG. 2 may be described as a continuous approach because it may be used to continuously verifying integrity of the signal path across the isolation barrier if such continuous verification is desired.

As with FIG. 1, in FIG. 2, one side of isolation analog-to-digital converter 200 is isolated from the other side of isolation analog-to-digital converter 200. For example, input pin 104, DC voltage 110, and analog-to-digital converter 114 are on the left side (as drawn in the diagram). The left side may be referred to as the "input side." Voltage input pin 106, output pin 108, filter 120, and check block 122 are on the right side (as drawn in the diagram). This may be referred to as the "input side." The low side is isolated from the input side through energy transfer 116 and coreless transformer 118. As with FIG. 1, in FIG. 2, the input side (left side) and the low side (right side) are generally separated in the block diagram of FIG. 2 along isolation barrier 124.

The example of FIG. 2 illustrates an example system for verifying integrity of a signal path across an isolation barrier by using a combined signal that may include DC voltage 110 and an input signal from input pin 104. The combination may be accomplished using addition/subtraction circuitry 202. Isolation analog-to-digital converter 114 may superimpose a pattern, e.g., DC voltage 110 on analog raw data captured by a sensor, such as a current sensor, or other sensor that may be input into an analog-to-digital converter. The superimposed pattern, e.g., DC voltage 110 may be inserted or superimposed to provide a "marking" on the analog raw data captured by the current sensors (or other sensor) at the input of isolation analog-to-digital converter 200.

In the example of FIG. 2, the "marking" may be retrieved and checked to verify the integrity of the signal path. In other words, the superimposed DC voltage 110 may be retrieved. The superimposed pattern may be retrieved at the input side. In the illustrated example of FIG. 2, the "marking" may be a DC offset added to a raw analog sample, transmitted through coreless transformer 118 and then removed from the information signal. In some examples, only the "ON/OFF" signal is required to pass over coreless transformer 118 which may be achieved by modulating the clock.

In one example, as illustrated in FIG. 2, circuitry such as signal addition/subtraction circuitry 202 or other circuitry designed to add, subtract, superimpose, or otherwise combined signals may be used to insert a marker signal into a signal path across an isolation barrier 124. Coreless transformer 118 may transmit a version of the marker signal across isolation barrier 124. For example, coreless transformer 118 may transmit a digital version of the marker signal across isolation barrier 124. The digital version of the marker signal may be generated using analog-to-digital converter 114. The received signal may be filtered at filter 120. Filter 120 may be a band pass filter, a low pass filter, high pass filter, or some combination of filters. In some examples, filter 120 may process the received signal to separate the known reference signal and the signal input on input pin 104. Check block 122 and/or processor 102 may then receive the filtered signal comprising the transmitted version of the marker signal. Check block 122 and/or processor 102 or other processing circuitry may verify the integrity of the signal path based on the received signal.

Figure 3:
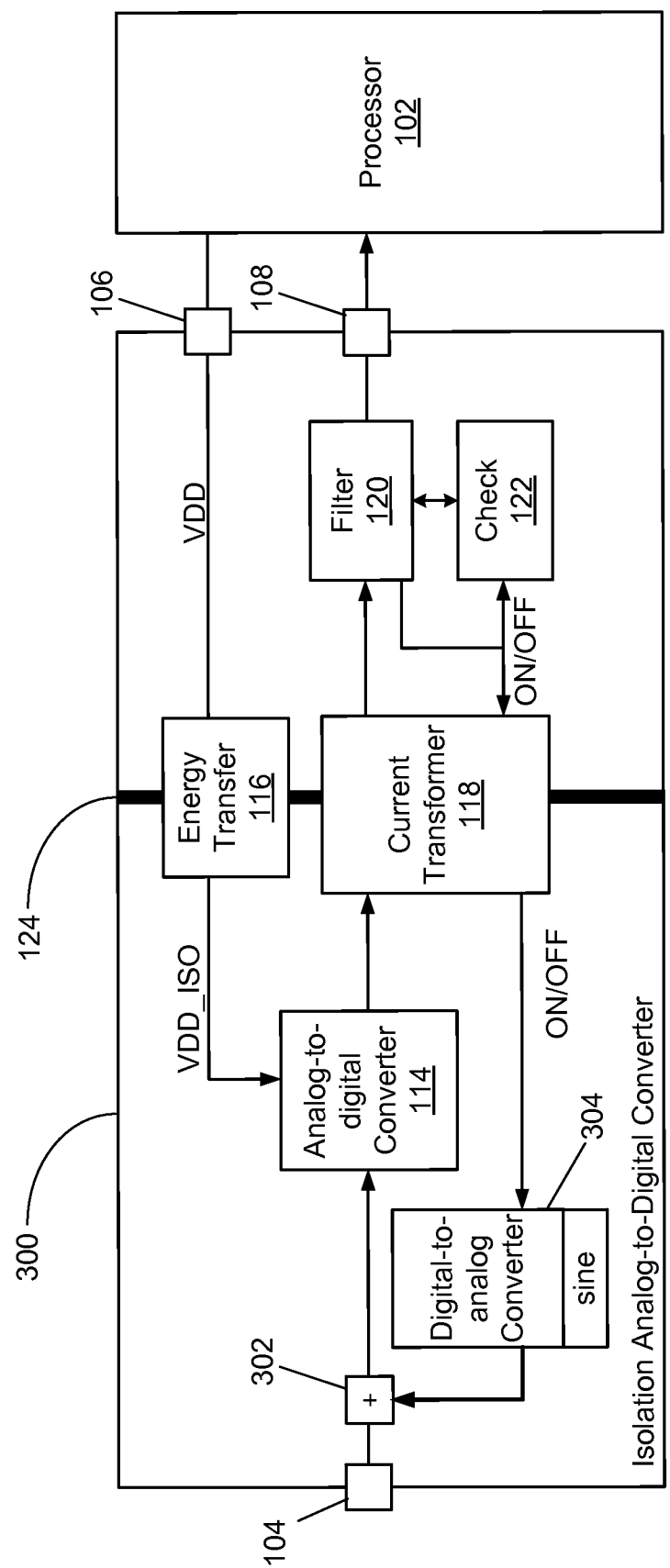
FIG. 3 is a block diagram illustrating another example system for verifying integrity of a signal path across an isolation barrier in accordance with one or more aspects of the present disclosure.

FIG. 3 is a block diagram illustrating another example system for verifying integrity of a signal path across an isolation barrier in accordance with one or more aspects of the present disclosure. Some aspects of the present disclosure may check the integrity of a data path through an isolation analog-to-digital converter 300. Similar to FIG. 2, in FIG. 3, checking the integrity of a data path through an isolation analog-to-digital converter 300 may be done by adding a known signal to an input signal and inputting the combined signal to analog-to-digital converter 114 and checking the received signal output by isolation analog-to-digital converter 300 after processing through the circuitry of isolation analog-to-digital converter 300.

In the example of FIG. 3, however, the known signal may be a sine wave. Other wave forms may also be used, such as square waves, triangle waves, or other signals. Generally, the signal used to check the integrity of the analog-to-digital converter data path just needs to be some known signal. As in FIGS. 1 and 2, in FIG. 3, the checking may be done, for example by check block 122 or processor 102. FIG. 3 is generally similar to FIGS. 1 and 2 and includes an isolation analog-to-digital converter 300 that is coupled to processor 102. Isolation analog-to-digital converter 300 may output data to processor 102 from output pin 108. Processor 102 may again provide a voltage source, VDD to voltage input pin 106 of isolation analog-to-digital converter 300.

The illustrated isolation analog-to-digital converter 300 of FIG. 3 also includes input pin 104 that may be an analog input and output pin 108. The signal output at output pin 108 may not be in the same form as the signal input at input pin 104. For example, an analog signal may be input at input pin 104 and a digital signal may be output at output pin 108.

Similar to FIG. 2, the block diagram of FIG. 3 illustrates an example system for verifying integrity of a signal path across an isolation barrier using what may be a continuous approach. In other words, a test signal, e.g., sine wave, and an input signal at input pin 104 may both be input into an input of analog-to-digital converter 114 at the same time. Accordingly, while multiplexer 112 is illustrated in FIG. 1, no multiplexer is needed or illustrated in FIGS. 2 and 3.

The example of FIG. 3 may be described as a continuous approach because it is possible to transmit both the test signal, e.g., a sine wave, and the signal on input pin 104 at the same time and thus it is possible to continuously verify integrity of the signal path across the isolation barrier. Again, while the example of FIG. 3 may be described as a continuous approach, this does not mean that the example of FIG. 3 must be used to continuously verifying integrity of the signal path across the isolation barrier. Rather, the example of FIG. 3, like the example of FIG. 2, may be described as a continuous approach because it may be used to continuously verifying integrity of the signal path across the isolation barrier if such continuous verification is desired.

As with FIGS. 1 and 2, in FIG. 3 one side of isolation analog-to-digital converter 300 is isolated from the other side of isolation analog-to-digital converter 300. For example, input pin 104, and analog-to-digital converter 114 are on the left side (as drawn in the diagram). Accordingly, the left side of FIG. 3 may be referred to as the "input side." Voltage input pin 106, output pin 108, filter 120, and check block 122 are on the right side (as drawn in the diagram). Accordingly, the right side of FIG. 3 may be referred to as the "low side." The low side is isolated from the input side through energy transfer 116 and coreless transformer 118. As with FIGS. 1 and 2, in FIG. 3, the low side (right side) and the input side (left side) are generally separated in the block diagram of FIG. 3 along isolation barrier 124.

The example of FIG. 3 illustrates an example system for verifying integrity of a signal path across an isolation barrier by using a combined signal that may include a sine wave and an input signal from input pin 104. Analog-to-digital converter 114 may process a superimposed pattern, e.g., a sine wave and analog raw data captured by a sensor, such as a current sensor, or other sensor that may be input into an analog-to-digital converter. The superimposed pattern may be inserted or superimposed to provide a "marking" on the analog raw data captured by the current sensors (or other sensor) at the input of isolation analog-to-digital converter 300.

In the example illustrated in FIG. 3, a sine wave of known value may be superimposed on the input of the analog-to-digital converter 114. A representation of this signal may be detect on the low side with a different filter path. Generally, the sine wave will need to be outside the useful input signal bandwidth but inside the analog-to-digital converter's bandwidth. In this way, the sine wave will not disturb the input signal, i.e., at input pin 104, as it will be outside of the bandwidth used by the signal on the input pin and it will be removed by the normal filter. The sine wave can be generated by digital-to-analog converter 304, which may be running in a loop through a table containing data representative of a sine wave or other wave form, depending on the wave form used as a known test signal. The sine wave, or other wave form, as described above may be added into the signal path using signal addition circuitry 302. Additional circuitry 302 may be any circuitry capable of combining the sine wave and the input signal, e.g., adding the signals together. Additionally, in the illustrated example of FIG. 3, "OFF/ON" of digital-to-analog converter 304 may be an option in order to save power consumption of the system.

In one example, as illustrated in FIG. 3, circuitry such as signal addition circuitry 302 or other circuitry designed to add, superimpose, or otherwise combined signals may be used to insert a marker signal into a signal path across an isolation barrier 124. Coreless transformer 118 may transmit a version of the marker signal across isolation barrier 124. For example, coreless transformer 118 may transmit a digital version of the marker signal across isolation barrier 124. The digital version of the marker signal may be generated using analog-to-digital converter 114. The received signal may be filtered at filter 120. Filter 120 may be a band pass filter, a low pass filter, high pass filter, or some combination of filters. In some examples, filter 120 may process the received signal to separate the known reference signal and the signal input on input pin 104. Check block 122 and/or processor 102 may then receive the filtered signal comprising the transmitted version of the marker signal. Check block 122 and/or processor 102 or other processing circuitry may verify the integrity of the signal path based on the received signal.

Figure 4:
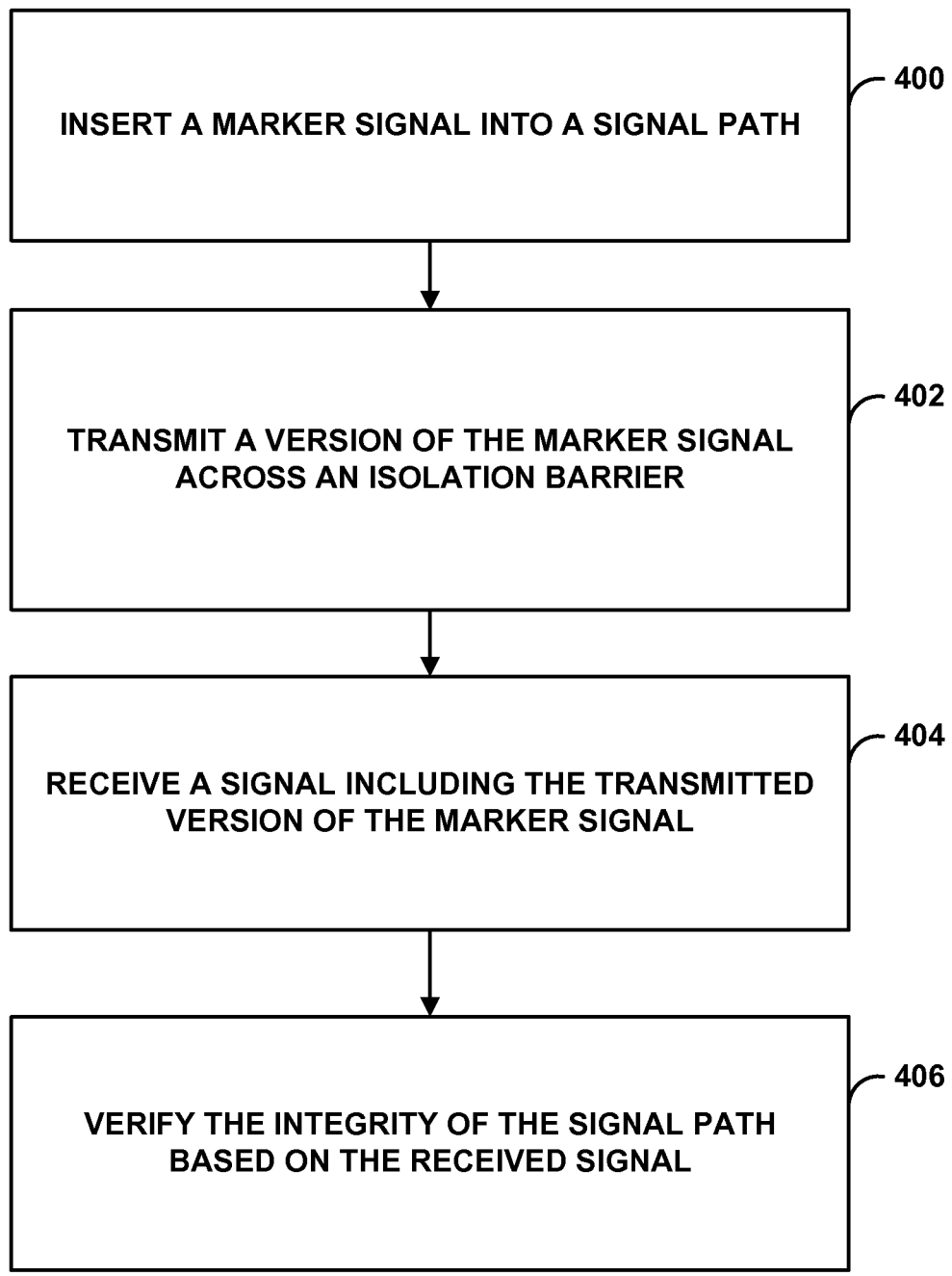
FIG. 4 is a flowchart illustrating an example method of verifying integrity of a signal path across an isolation barrier, in accordance with one or more aspects of the present disclosure.

FIG. 4 is a flowchart illustrating an example method of verifying integrity of a signal path across an isolation barrier, in accordance with one or more aspects of the present disclosure. In one example, circuitry may be used to insert a marker signal into a signal path across an isolation barrier 124 (400). The circuitry used to insert the marker signal may be multiplexer 112, signal addition/subtraction circuitry 202, signal addition circuitry 302, or other circuitry designed to multiplex, add, subtract, superimpose, or otherwise select or combined signals. The marker that may be multiplexed, added, subtracted, superimposed, or otherwise selected or combined may include an analog signal, such as a DC voltage 110, a sine wave, square wave, triangular wave, or other waveform.

Coreless transformer 118 may transmit a version of the marker signal across isolation barrier 124 (402). For example, coreless transformer 118 may transmit a digital version of the marker signal across isolation barrier 124. The digital version of the marker signal may be generated using analog-to-digital converter 114. Furthermore, as described herein, the actual signal transmitted across the isolation barrier 124 may, at various times, be an analog signal or a digital version of the known reference signal, e.g., DC voltage 110 or sine wave, a digital version of a signal input on input pin 104, or a digital version of a combination of the known reference signal and a signal input on input pin 104. The digital version of the combination of the known reference signal and the signal input on input pin 104 may be an addition of the known reference signal and the signal input on input pin 104, a subtraction of the known reference signal and the signal input on input pin 104, or some other combination of the known reference signal and the signal input on input pin 104.

Check block 122 and/or processor 102 may receive a signal comprising the transmitted version of the marker signal (404). The received signal may be filtered at filter 120. Filter 120 may be a band pass filter, a low pass filter, high pass filter, or some combination of filters. In some examples, filter 120 may process the received signal to separate the known reference signal and the signal input on input pin 104. As discussed above with respect to FIG. 3, generally, the sine wave will need to be outside the useful input signal bandwidth but inside the analog-to-digital converter's bandwidth. Because the sine wave is outside the useful input signal bandwidth, the sine wave will not disturb the input signal, i.e., at input pin 104, as it will be outside of the bandwidth used by the signal on the input pin. Accordingly, filter 120 or other filtering circuitry may be used to separate these signals. In other examples, filtering to separate the known reference signal and the signal input on input pin 104 may be performed in processor 102, e.g., using digital filtering within processor 102.

Check block 122 and/or processor 102 or other processing circuitry verifies the integrity of the signal path based on the received signal (406). As described above, this may include filtering to separate the known reference signal and the signal input on input pin 104. Verification may include comparing the known reference signal to the representation of the known reference signal received. As described above, having the circuitry function correctly or within an acceptable accuracy range may vary from implementation to implementation. In some examples, it may be necessary for the data output at output pin 108 to correspond to the data signal input at input pin 104. In other examples, it may be necessary for the data output at output pin 108 to correspond to the data signal input at input pin 104 within 0.01%, 0.1%, 1%, 10%, or some other percentage, as may be determined based on requirements for the particular system. In some examples, when the output at output pin 108 is a digital value, the output may have to be accurate to within a certain number of bits at the output. These tolerances may also be applied to a system where the output is some function of the input, e.g., 0.5×input, 2×input. Accordingly, the output might have to be within 0.01%, 0.1%, 1%, 10% of 2×input (e.g., in the example where the output a function of the input and is supposed to be 2×input).

As described above, in some examples, when the output at output pin 108 is a digital value, the output may have to be accurate to within a certain number of bits at the output. For example, within 1 bits, 2 bits, or some other number of bits. As an example, assume that analog-to-digital converter 114 converts an analog input, such as DC voltage 110 or the input on input pin 104, to a 16 bit value, and this value must be received within 1 bit. Further assume that multiplexer 112 selects DC voltage 110 and that DC voltage 110 is converted to a digital representation using analog-to-digital converter 114. Assume that this digital representation is made up of the following bits: 1000 0000 0000 0000. If 1 bit accuracy is needed, then the binary values 1000 0000 0000 0001, 1000 0000 0000 0000, and 0111 1111 1111 1111 would each be considered accurate enough, while other binary values, such as 1000 0000 0000 0010 and 0111 1111 1111 1110 would not be considered accurate enough.

Various examples have been described. These and other examples are within the scope of the following claims.

What is claimed is:

1. A method comprising:
by an electronic device for verifying integrity of a signal path across an isolation barrier,
inserting a marker signal into the signal path across the isolation barrier by multiplexing the marker signal and at least one other input signal into the signal path, the marker signal comprising a known direct current (DC) voltage, in response to detection of an amplitude modulated clock signal that is transmitted across the isolation barrier;
transmitting, as a first signal, the marker signal across the isolation barrier;
receiving, as a second signal, the marker signal as transmitted across the isolation barrier; and
verifying the integrity of the signal path by comparing the first signal and the second signal and determining that a difference of a property of the marker signal that is comparable between the first signal and the second signal is within specification limit.

2. The method of claim 1, wherein the isolation barrier comprises a galvanic isolation barrier.

3. The method of claim 1, further comprising converting the marker signal to a digital signal in the signal path, the digital signal comprising the version of the marker transmitted across the isolation barrier.

4. An electronic device for verifying integrity of a signal path across an isolation barrier, the electronic device comprising:
circuitry for inserting a marker signal into the signal path across the isolation barrier, in response to detection of an amplitude modulated clock signal that is transmitted across the isolation barrier, by multiplexing the marker signal and at least one other input signal into the signal path, the marker comprising a known direct current (DC) voltage;
circuitry for transmitting, as a first signal, the marker signal across the isolation barrier;
circuitry for receiving, as a second signal, the marker signal as transmitted across the isolation barrier; and
circuitry for verifying the integrity of the signal path by comparing the first signal and the second signal and determining that a difference of a property of the marker signal that is comparable between first signal and the second signal is within specification limit.

5. The electronic device of claim 4, wherein the isolation barrier comprises a galvanic isolation barrier.

6. The electronic device of claim 4, further comprising an analog-to-digital converter for converting the marker signal to a digital signal in the signal path, the digital signal comprising the version of the marker transmitted across the isolation barrier.

7. The electronic device of claim 4, wherein the circuitry for inserting the marker signal into the signal path across the isolation barrier comprises at least one of a multiplexer, signal addition/subtraction circuitry, or signal addition circuitry.

8. The electronic device of claim 4, wherein the circuitry for transmitting the version of the marker signal across the isolation barrier comprises a current transformer.

9. The electronic device of claim 4, wherein the circuitry for receiving the signal comprises at least one of a filter, a check circuit, or a processor and wherein the circuitry for verifying the integrity of the signal path comprises at least one of a filter, a check circuit, or a processor.

10. An electronic device for verifying integrity of a signal path across an isolation barrier, the electronic device comprising:
    means for inserting a marker signal into the signal path across the isolation barrier in response to detection of a clock signal that is amplitude modulated and that is transmitted across the isolation barrier as a command for inserting the marker signal into the signal path across the isolation barrier, the marker comprising an analog signal;
    means for transmitting, as a first signal, the marker signal across the isolation barrier;
    means for receiving, as a second signal, the marker signal as transmitted across the isolation barrier; and
    means for verifying the integrity of the signal path by comparing the first signal and the second signal and determining that a difference of a property of the marker signal that is comparable between the first signal and the second signal is within specification limit.

11. The electronic device of claim 10, wherein the isolation barrier comprises means for a galvanic isolation barrier.

12. The electronic device of claim 10, further comprising means for converting the marker signal to a digital signal in the signal path, the digital signal comprising the version of the marker transmitted across the isolation barrier.

13. The electronic device of claim 10, wherein the means for inserting the marker signal into the signal path superimposes the marker signal and at least one other input signal into the signal path.

\* \* \* \* \*